United States Patent
Utsunomiya et al.

(10) Patent No.: US 8,034,175 B2
(45) Date of Patent: Oct. 11, 2011

(54) APPARATUS AND METHOD FOR MANUFACTURING SEMICONDUCTOR DEVICE, AND ELECTRONIC APPARATUS

(75) Inventors: Sumio Utsunomiya, Suwa (JP); Mitsuru Sato, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 912 days.

(21) Appl. No.: 11/389,079

(22) Filed: Mar. 27, 2006

(65) Prior Publication Data

US 2006/0223328 A1    Oct. 5, 2006

(30) Foreign Application Priority Data

Apr. 1, 2005 (JP) .................................. 2005-106889

(51) Int. Cl.
*C23C 16/00* (2006.01)

(52) U.S. Cl. ............... 118/715; 118/723 R; 156/345.29; 438/638; 438/715

(58) Field of Classification Search .................. 118/715, 118/723 R; 438/689, 715; 156/345.29
See application file for complete search history.

(56) References Cited

U.S. PATENT DOCUMENTS

| | | | |
|---|---|---|---|
| 3,272,591 A | 9/1966 | Rudness et al. | |
| 3,652,431 A * | 3/1972 | Reynolds | 205/338 |
| 3,870,472 A | 3/1975 | Adamski et al. | |
| 3,876,382 A | 4/1975 | Falckenberg | |
| 3,917,459 A | 11/1975 | Falckenberg et al. | |
| 4,466,179 A | 8/1984 | Kasten | |
| 4,494,300 A | 1/1985 | Schwuttke et al. | |
| 4,682,206 A | 7/1987 | Tsuya et al. | |
| 5,314,847 A * | 5/1994 | Watanabe et al. | 438/770 |
| 5,500,256 A * | 3/1996 | Watabe | 427/579 |
| 5,647,741 A * | 7/1997 | Bunya et al. | 432/180 |
| 5,786,277 A | 7/1998 | Yamamoto | |
| 6,000,789 A | 12/1999 | Takagi et al. | |
| 6,047,552 A * | 4/2000 | Gross et al. | 60/752 |
| 6,130,397 A | 10/2000 | Arai | |
| 6,187,616 B1 | 2/2001 | Gyoda | |
| 6,264,316 B1 | 7/2001 | Chino | |
| 6,271,066 B1 | 8/2001 | Yamazaki et al. | |
| 6,505,484 B1 | 1/2003 | Fujiwara et al. | |
| 6,984,267 B2 * | 1/2006 | Irino et al. | 118/715 |
| 7,514,306 B2 | 4/2009 | Utsunomiya | |
| 2002/0153360 A1 | 10/2002 | Yamazaki et al. | |
| 2004/0155244 A1 | 8/2004 | Kawata et al. | |
| 2005/0019997 A1 | 1/2005 | Kusumoto et al. | |
| 2005/0217799 A1 * | 10/2005 | O'Meara et al. | 156/345.52 |

(Continued)

FOREIGN PATENT DOCUMENTS

CN    A-1161569    10/1997

(Continued)

OTHER PUBLICATIONS

Higashi et al., "Crystallization of Si Thin Film Using Thermal Plasma Jet and Its Application to Thin-Film Transistor Fabrication," AM-LCD, Technical Digest Papers, 2004.

*Primary Examiner* — Ram Kackar
*Assistant Examiner* — Satish Chandra
(74) *Attorney, Agent, or Firm* — Oliff & Berridge, PLC (57) ABSTRACT

A method for manufacturing a semiconductor device, comprises providing a semiconductor layer deposited on a substrate with heat treatment by using a flame of a gas burner fueled by a hydrogen-and-oxygen mixed gas as a heat source.

6 Claims, 7 Drawing Sheets

U.S. PATENT DOCUMENTS

| | | | |
|---|---|---|---|
| 2006/0134347 | A1 | 6/2006 | Chiruvolu et al. |
| 2006/0223328 | A1 | 10/2006 | Utsunomiya et al. |
| 2007/0051135 | A1* | 3/2007 | Machida et al. ............ 65/377 |
| 2007/0111450 | A1 | 5/2007 | Sato et al. |
| 2007/0202319 | A1 | 8/2007 | Bryan et al. |
| 2007/0232034 | A1 | 10/2007 | Utsunomiya |
| 2008/0087213 | A1 | 4/2008 | Sato et al. |
| 2008/0090388 | A1 | 4/2008 | Sato et al. |

FOREIGN PATENT DOCUMENTS

| | | |
|---|---|---|
| CN | A-1263636 | 8/2000 |
| CN | A-1518129 | 8/2004 |
| JP | A-56-137643 | 10/1981 |
| JP | A-04-284630 | 10/1992 |
| JP | A-06-013407 | 1/1994 |
| JP | A-06-069127 | 3/1994 |
| JP | A-06-302511 | 10/1994 |
| JP | B2-08-008255 | 1/1996 |
| JP | A-09-156916 | 6/1997 |
| JP | A-09-293687 | 11/1997 |
| JP | A-10-006523 | 1/1998 |
| JP | A-11-135492 | 5/1999 |
| JP | A 11-145148 | 5/1999 |
| JP | A-2003-130315 | 5/2003 |
| JP | A-2003-197618 | 7/2003 |
| KR | B1-94-010509 | 10/1994 |

* cited by examiner

APPARATUS AND METHOD FOR MANUFACTURING SEMICONDUCTOR DEVICE, AND ELECTRONIC APPARATUS

BACKGROUND OF THE INVENTION

1. Technical Field

The present invention relates to a method for manufacturing a semiconductor device. The invention also relates to heat treatment that can lower costs to manufacture a semiconductor device and can provide even and high performance of transistor elements.

2. Related Art

Examples of silicon recrystallization methods to recrystallize silicon that has been deposited on a substrate by a process such as chemical vapor deposition includes: solid-phase growth through high-temperature heat treatment at 800 to 1000 degrees Celsius; laser annealing through excimer laser radiation; and thermal plasma jet using thermal plasma as a heat source. JP-A-11-145148 and *Crystallization of Si Thin Film Using Thermal Plasma Jet and Its Application to Thin-Film Transistor Fabrication* (S. Higashi, AM-LCD '04 Technical Digest Papers, p. 179) are examples of related art.

The above-mentioned methods, however, have the following problems. The solid-phase growth involving heat treatment requires a semiconductor substrate used to sustain such high temperatures of 800 to 1000 degrees Celsius, that the substrate is practically limited to be made of quartz glass. However, it is economically difficult to manufacture a large substrate of expensive quartz glass. The laser annealing allows a silicon film to crystallize in an extremely short period of time, and is applicable to a wide variety of substrates even with poor heat resistance, such as glass or resin substrates. This method, however, requires high running costs and causes wide variation in element properties. The thermal plasma jet also allows a silicon film to crystallize in a short time, but consumes a lot of electricity for the heat source and a great amount of the rare gas argon (Ar), resulting in high costs.

SUMMARY

An advantage of the present invention is to provide an apparatus and a method for manufacturing a semiconductor device that can apply quality heat treatment to a large semiconductor substrate through a low-temperature process.

A method for manufacturing a semiconductor device according to one aspect of the invention includes providing a semiconductor layer deposited on a substrate with heat treatment by using a flame of a gas burner fueled by a hydrogen-and-oxygen mixed gas as a heat source.

This structure provides the semiconductor layer with a vapor gas produced by combustion accompanied with heating, making it possible to terminate dangling bonds in the semiconductor layer with hydrogen or oxygen and to reduce a carrier-trap density while recrystallizing the layer. In addition, a large heat source can be used by applying the gas burner, making it possible to provide a large substrate with heat treatment. Moreover, since water is decomposed to acquire hydrogen and oxygen serving as fuels, the fuels are easily and economically available.

In the above-mentioned method, the hydrogen-and-oxygen mixed gas is preferably hydrogen rich to recrystallize the semiconductor layer in the heat treatment. Thus, dangling bonds in the semiconductor layer are terminated with hydrogen.

In the above-mentioned method, the hydrogen-and-oxygen mixed gas is preferably oxygen rich to modify the semiconductor layer provided with an oxidized film on a surface thereof in the heat treatment. The oxidized film (e.g. gate insulation film) is thus provided, and an interface state density between the gate insulation film and the semiconductor layer decreases.

A method for manufacturing a semiconductor device according to another aspect of the invention includes: depositing a semiconductor layer on a substrate; providing first heat treatment to recrystallize the semiconductor layer by using a flame of a gas burner fueled by a hydrogen-and-oxygen mixed gas that is hydrogen rich as a heat source; providing an oxidized film to the semiconductor layer that has undergone the first heat treatment; and providing second heat treatment to modify the semiconductor layer that has been provided with the oxidized film by using a flame of a gas burner fueled by a hydrogen-and-oxygen mixed gas that is oxygen rich as a heat source.

It is thus possible to terminate dangling bonds in the semiconductor layer and modify an interface between the gate insulation film and the semiconductor layer.

In the above-mentioned method, the gas burner preferably provides a linear flame that relatively scans the semiconductor layer in the heat treatment. It is thus possible to provide a large semiconductor substrate with heat treatment.

In the above-mentioned method, a gap between the gas burner and the substrate is preferably changed to regulate one of a temperature and pressure of the flame to which the semiconductor layer is exposed.

In the above-mentioned method, a posture of the gas burner to the substrate is preferably changed to regulate a pressure of the flame to which the semiconductor layer is exposed.

In the above-mentioned method, the gas burner preferably includes an air duct that introduces the mixed gas and a shield. The shield has a combustion chamber that surrounds the air duct and where the mixed gas combusts, and a nozzle that emits a combustion gas.

It is thus possible to control the state of the combustion gas (flame) with the nozzle.

In the above-mentioned method, the air duct preferably has a portion defining a plurality of opening at regular intervals and is moved forward and backward or rotated. It is thus possible to emit the combustion gas evenly to the semiconductor substrate.

In the above-mentioned method, a temperature of the flame is preferably regulated by adding an inert gas, such as argon, nitrogen, and helium, to the hydrogen-and-oxygen mixed gas.

By using an inert gas in addition to the hydrogen-and-oxygen mixed gas, a range of the combustion temperature and a range of the pressure of the gas emitted from the nozzle increase.

In the above-mentioned method, the substrate and the gas burner are preferably contained in a chamber into which an inert gas is introduced to regulate the pressure in the chamber. It is thus possible to control oxidation of the semiconductor substrate that has been heated.

The above-mentioned method preferably includes heating the substrate prior to the heat treatment. It is thus possible to prevent heat shock of the semiconductor substrate associated with a rapid temperature change. The substrate can be heated with an electric heater built in a stage, for example.

A semiconductor manufacturing apparatus according to yet another aspect of the invention includes: a water tank that stores water, an electrolytic tank in which the water is decomposed into a hydrogen-and-oxygen mixed gas by an electric current, a gas burner that combusts the hydrogen-and-oxygen mixed gas to provide a linear flame, a gas controller that adds a gas to the mixed gas to regulate a mixing ratio of the mixed gas, and a moving mechanism that moves a semiconductor substrate relative to the flame of the gas burner in a direction perpendicular to the flame.

It is thus possible to terminate dangling bonds in the semiconductor layer with a vapor gas produced while heat treatment of the semiconductor layer. Also, it is possible to provide a heat-treatment device that can provide a large semiconductor substrate with heat treatment.

In the above-mentioned apparatus, the gas burner preferably includes an air duct that introduces the mixed gas, and a shield. The shield includes a combustion chamber that surrounds the air duct and where the mixed gas combusts, and a nozzle that has a linear opening and emits a combustion gas. It is thus possible to control the state of the combustion gas with the nozzle included in the gas burner.

In the above-mentioned apparatus, the air duct preferably has a portion defining a plurality of opening at regular intervals and is moved forward and backward or rotated. It is thus possible to emit the combustion gas evenly to the semiconductor substrate for heat treatment.

In the above-mentioned apparatus, the air duct is preferably moved forward and backward toward the nozzle in the shield. It is thus possible to control temperature state of the combustion gas emitted from the nozzle.

In the above-mentioned apparatus, the gas controller preferably sets the mixed gas relatively hydrogen rich to recrystallize a semiconductor film deposited on the semiconductor substrate. It is thus possible to decrease dangling bonds in the semiconductor layer.

In the above-mentioned apparatus, the gas controller preferably sets the mixed gas relatively oxygen rich to provide a gate insulation film (oxidized film) deposited on the semiconductor substrate with heat treatment. It is thus possible to decrease an interface state density between the gate insulation film (oxidized film) and the semiconductor layer.

In the above-mentioned apparatus, the gas controller preferably adds an inert gas to the mixed gas to regulate a temperature of the flame. It is thus possible to increase a range of the temperature.

The above-mentioned apparatus preferably includes a heater that heats or preheats the semiconductor substrate. It is thus possible to raise the temperature of the semiconductor substrate to a predetermined level prior to the heat treatment, and to prevent heat shock of the substrate associated with a rapid temperature change with the flame.

An electronic apparatus according to a still another aspect of the invention includes a semiconductor manufactured by any of the above-described semiconductor manufacturing methods. Therefore, the electronic apparatus is highly reliable.

The electronic apparatus includes a display manufactured by any of the above-described semiconductor manufacturing methods. More specifically, the electronic apparatus includes a video camera, a television set, a wide screen, a cellular phone, a computer, and a personal digital assistant, for example.

BRIEF DESCRIPTION OF THE DRAWINGS

The invention will be described with reference to the accompanying drawings, wherein like numbers reference like elements.

DESCRIPTION OF EXEMPLARY EMBODIMENTS

According to one embodiment of the invention, a gas burner fueled by a hydrogen-oxygen mixed gas is used to recrystallize a silicon layer (semiconductor layer) through heat treatment. Hydrogen and oxygen are also used to reform the silicon layer. The mixed gas is appropriately set to be hydrogen rich (excess of hydrogen) or oxygen rich (excess of oxygen) by regulating the mixing ratio, flow rate, pressure or other conditions of hydrogen and oxygen. Combustion gas includes vapor gas, hydrogen and oxygen at rates depending on the conditions.

By introducing hydrogen and oxygen included in the combustion gas to a silicon thin film, it is possible to terminate dangling bonds of silicon atoms and inactivate them electrically (i.e., vapor annealing). Thus the carrier-trap density of the silicon thin film is lowered, and its carrier mobility increases as a result.

By exposing the silicon layer to plasma-hydrogen gas as well as introducing hydrogen and oxygen included in the combustion gas to a silicon thin film, it is possible to terminate dangling bonds of silicon atoms and inactivate them electrically (i.e., hydrogen treatment). Thus the carrier-trap density of the silicon thin film is lowered, and its carrier mobility increases as a result.

Semiconductor Manufacturing Apparatus

Figure 1:
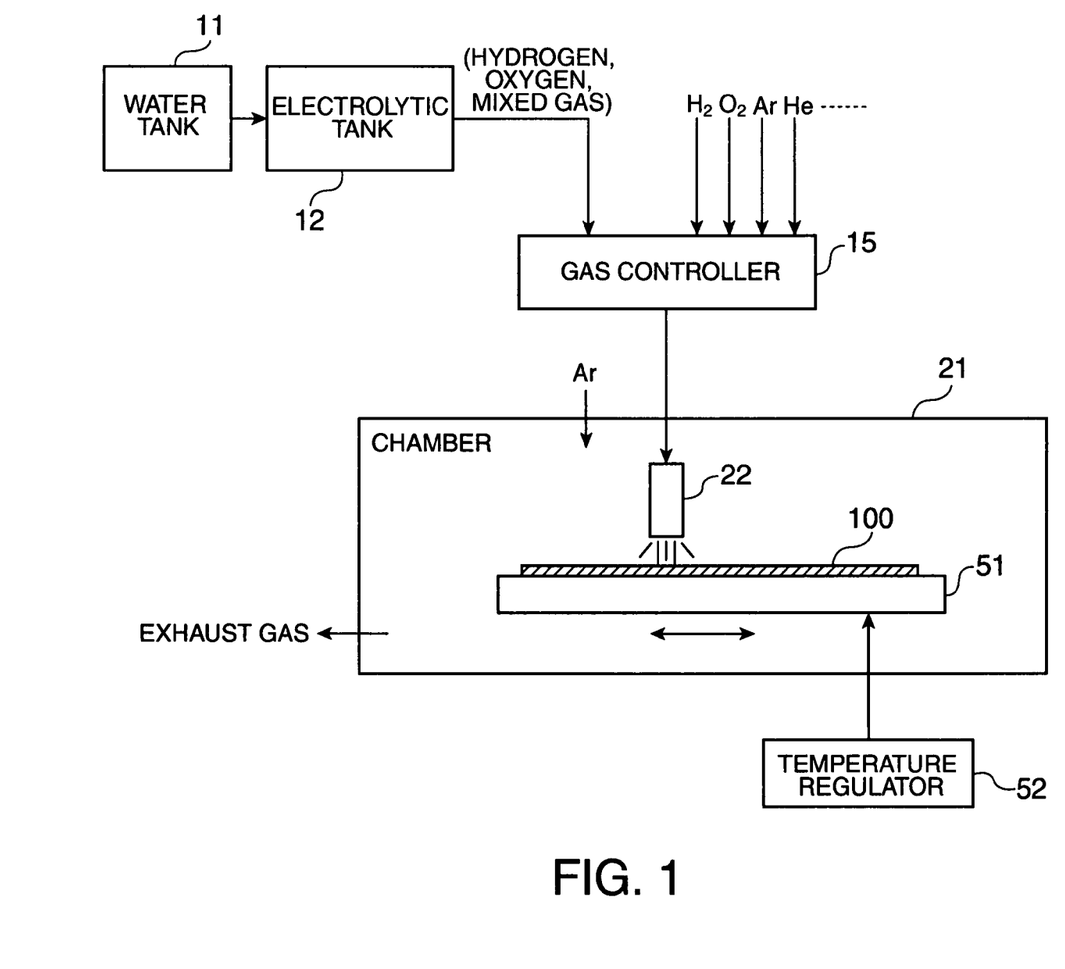
FIG. 1 is a diagram to illustrate a semiconductor manufacturing apparatus according to one embodiment of the invention.

Referring to FIG. 1, a semiconductor manufacturing apparatus according to the present embodiment will be described.

In FIG. 1, a water tank 11 stores pure water and supplies it to an electrolytic tank (electrolytic device) 12. In the electrolytic tank 12, water is decomposed into hydrogen gas and oxygen gas by an electric current. The resultant hydrogen and oxygen gases are then supplied to a gas controller 15. The gas controller 15 includes a computer system, a pressure regulator valve, a flow regulator valve, and sensors, for example. The controller regulates the amount, pressure, mixing ratio or other conditions of the hydrogen and oxygen gases (mixed gas) supplied to a gas burner 22 at a downstream location in accordance with a preset program.

The gas controller 15 can introduce hydrogen and oxygen gases supplied from a gas tank (not shown) further to the mixed gas. Accordingly, the hydrogen-oxygen mixing ratio of the mixed gas can be deviated from stoichiometric compositions to hydrogen rich or oxygen rich.

The gas controller 15 can also introduce inert gas, such as argon (Ar), nitrogen (N) or helium (He), supplied from a gas tank (not shown) further to the mixed gas. Accordingly, the flame temperature (combustion temperature) and flame status of the gas burner 22 can be controlled.

The water tank 11, the electrolytic tank 12, and the gas controller 15 make up a fuel (raw material) supply part.

Provided at a downstream location of the gas controller 15 is a chamber 21 defining a closed space. Placed in this chamber 21 are the gas burner 22 and a stage 51, for example. The gas burner 22 provides a flame for heat treatment. On the stage 51, a semiconductor substrate 100 to be processed is placed. The stage 51 enables the substrate 100 to move relative to the gas burner 22.

An atmosphere in the chamber 21 may be, but not limited to, set such that the internal pressure ranges from atmospheric pressure to about 0.5 MPa and the internal temperature ranges from room temperature to about 100 degrees Celsius. For example, the conditions can be set such that they are preferable for vapor annealing. To maintain the internal pressure of the chamber 21 at a desired level, argon or other inert gases as described above can be introduced in the chamber 21.

The stage 51 includes a mechanism that moves a table on which the substrate is placed at a constant rate to prevent particle deposition. Provided to this table on which the substrate 100 is placed are heating and cooling mechanisms. The mechanisms prevent heat shock of the semiconductor substrate 100 associated with a rapid temperature change, and their temperatures are controlled by an external temperature regulator 52. For example, an electric heating mechanism and a cooling mechanism using coolant gas or water may be used here.

Figure 2:
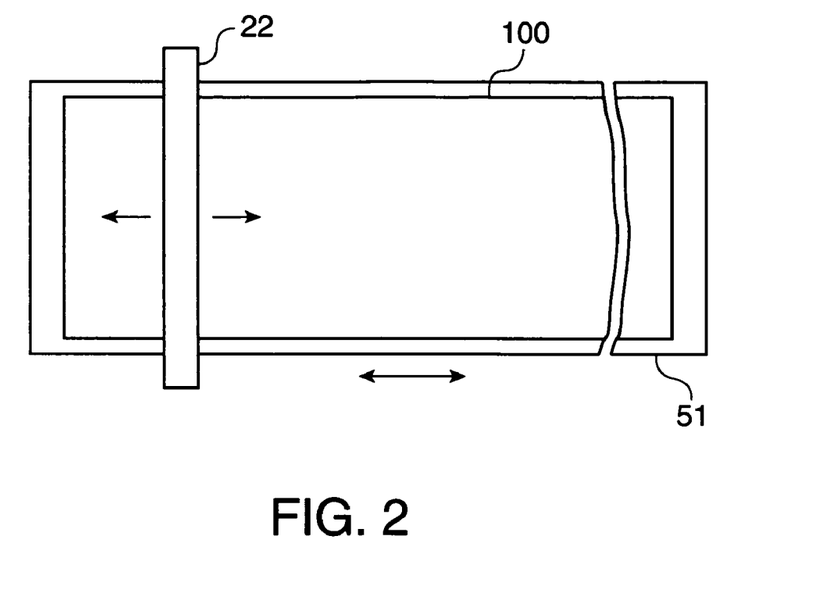
FIG. 2 is a diagram to illustrate a gas burner 22 according to the embodiment of the invention.

As shown in the plan view of FIG. 2, the gas burner 22 is made of a member that is longer than the width (the up-and-down direction in the view) of the stage 51. The gas burner 22 performs scanning with the semiconductor substrate 100 by moving the stage 51 in a direction perpendicular to the longitudinal direction of the gas burner 22 or by moving the gas burner 22 itself.

Figure 3:
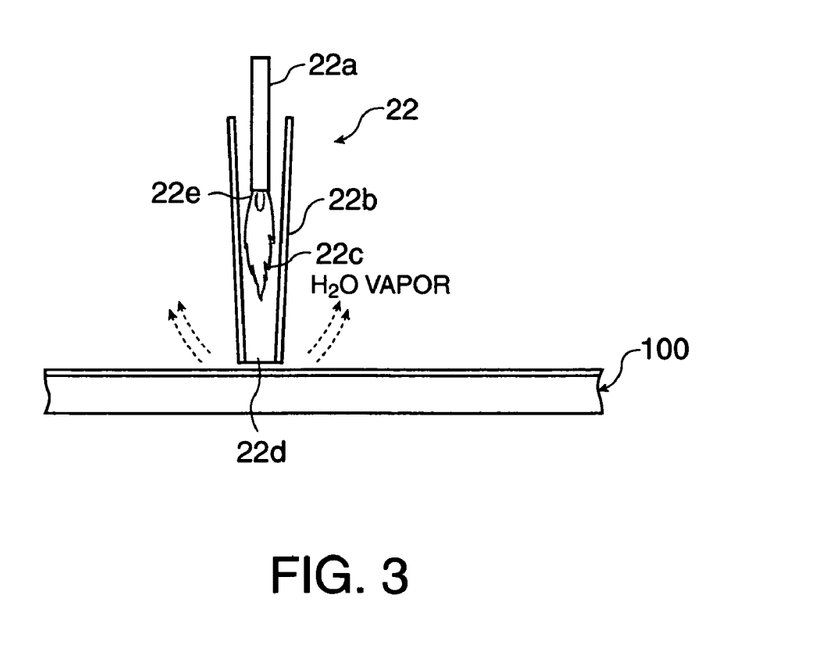
FIG. 3 illustrates the gas burner.

Referring to FIG. 3, the gas burner 22 includes an air duct 22a, a shield 22b surrounding the air duct 22b, a combustion chamber 22c surrounded by the shield 22b, a nozzle 22d, and a mixed-gas outlet 22e. The air duct 22a has a gas outlet through which the mixed gas is introduced to the combustion chamber 22c, where the mixed gas combusts. The nozzle 22d serves as an outlet of the combustion gas getting out of the shield 22b. The mixed-gas outlet 22e is provided to the air duct 22a. The broader the gap between the nozzle 22d and the semiconductor substrate 100, the lower the pressure at which the nozzle emits the combustion gas becomes. In contrast, the narrower the gap between the nozzle 22d and the semiconductor substrate 100, the higher the pressure becomes owing to restrained reduction in the of the combustion gas. Accordingly, the gas pressure can be regulated by changing the gap. Pressurization can facilitate vapor annealing, hydrogen annealing, oxygen annealing or the like. Various annealing methods can be used by setting appropriate mixed-gas conditions.

As will be described below, the combustion chamber 22c included in the gas burner 22 may provide a linear (long) flame (torch) or multiple torches by making the mixed-gas outlet 22e linear or multiple, for example. Preferably, the outlet 22e and the nozzle 22d of the shield 22b are designed such that a temperature profile near the gas burner 22 becomes rectangular in the flame scanning direction.

Figure 4A:
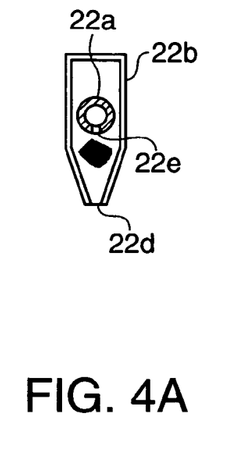
FIGS. 4A and 4B show a configuration example of the gas burner.
Figure 4B:
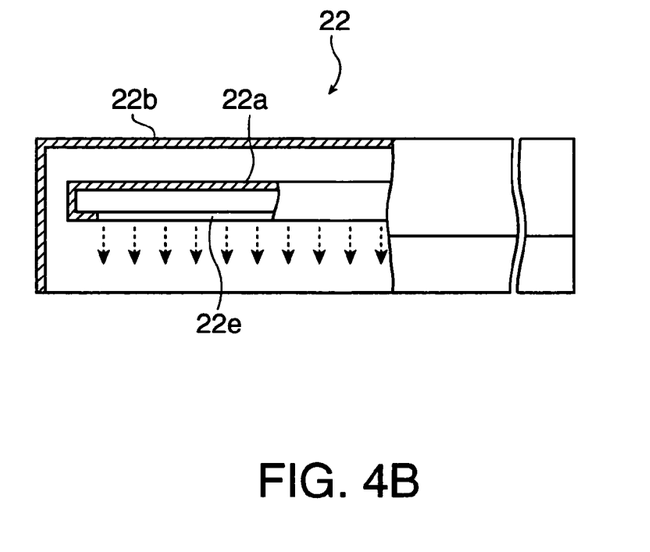

FIGS. 4A and 4B show a configuration example of the gas burner 22. FIG. 4A is a sectional view of the gas burner 22 in the transverse direction, while FIG. 4B is a sectional view of the gas burner 22 in the longitudinal direction. Like elements corresponding to those of FIG. 3 are indicated by like numerals.

In this configuration example, the shield 22b surrounds the air duct 22a. The nozzle 22d is provided below the shield 22b, while the gas outlet 22e is provided as a linear hole below the air duct 22a on a side adjacent to the nozzle 22d. The gas outlet 22e may have variable widths, so that every part of the linear outlet can emit the same amount of gas.

Figure 5A:
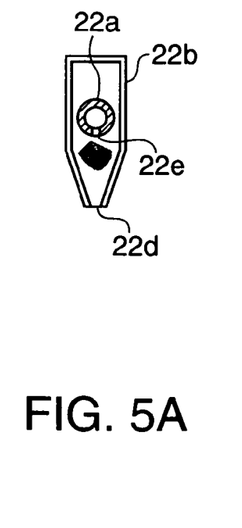
FIGS. 5A and 5B show another configuration example of the gas burner.
Figure 5B:
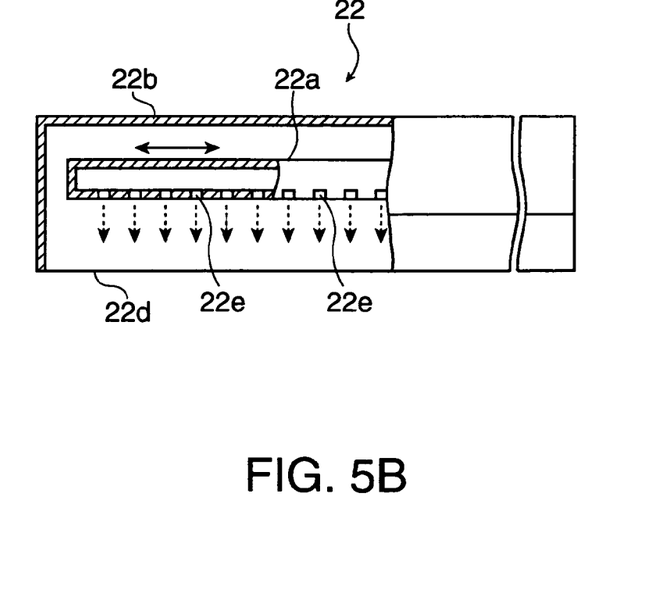

FIGS. 5A and 5B show another configuration example of the gas burner 22. FIG. 5A is a sectional view of the gas burner 22 in the transverse direction, while FIG. 5B is a sectional view of the gas burner 22 in the longitudinal direction. Like elements corresponding to those of FIG. 3 are indicated by like numerals.

Also in this configuration example, the shield 22b surrounds the air duct 22a. The nozzle 22d is provided below the shield 22b, while a plurality of gas outlets, each of which is the gas outlet 22e, are provided at regular intervals below the air duct 22a on a side adjacent to the nozzle 22d. The combustion chamber thus configured has an even gas density. The air duct 22a moves in the left-right direction in the drawing to make the outward gas flow from the nozzle 22d even. Alternatively, the air duct 22a may be fixed if the gas outlets 22e are provided at such irregular intervals that they can provide the same amount of gas through every part of them.

Figure 6A:
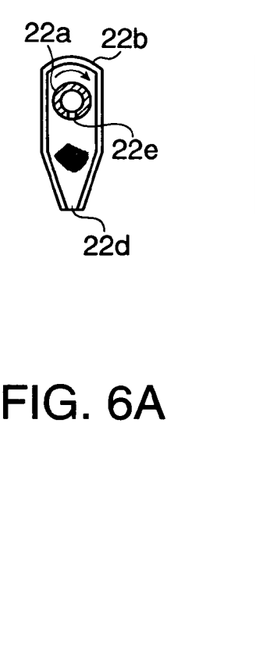
FIGS. 6A and 6B show yet another configuration example of the gas burner.
Figure 6B:
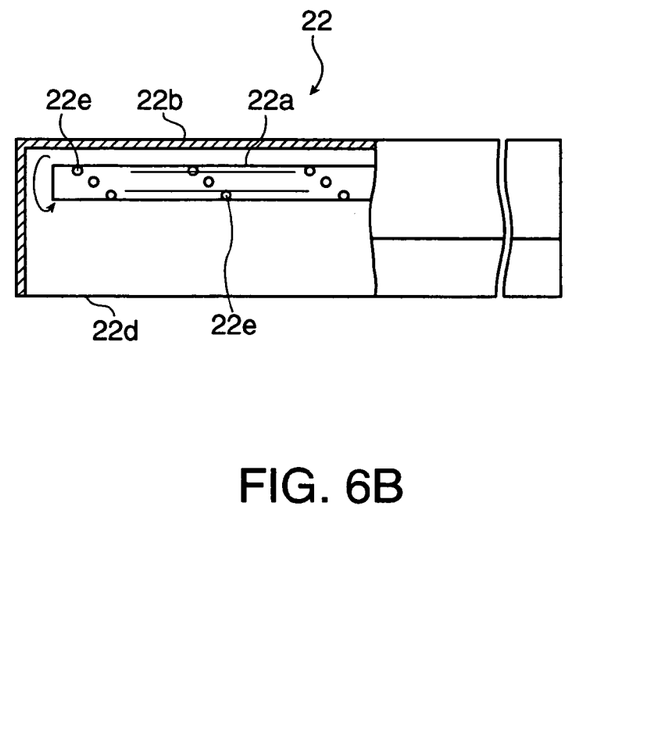

FIGS. 6A and 6B show yet another configuration example of the gas burner 22. FIG. 6A is a sectional view of the gas burner 22 in the transverse direction, while FIG. 6B is a sectional view of the gas burner 22 in the longitudinal direction. Like elements corresponding to those of FIG. 3 are indicated by like numerals.

Also in this configuration example, the shield 22b surrounds the air duct 22a. The nozzle 22d is provided below the shield 22b, while a plurality of gas outlets, each of which is the gas outlet 22e, are provided at regular intervals in a spiral manner on the side surface of the air duct 22a. The combustion chamber thus configured has an even gas density. The air duct 22a moves in a rotary motion to make the outward gas flow from the nozzle 22d even.

Figure 7A:
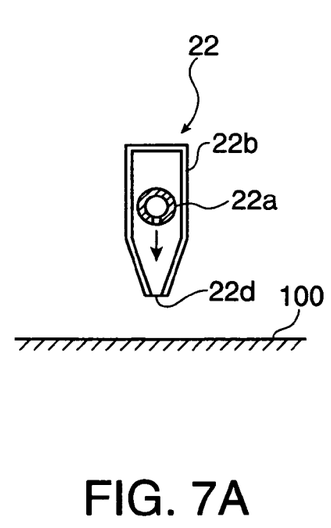
FIGS. 7A and 7B show an example how the pressure of the gas burner's flame (combustion gas) is regulated.
Figure 7B:
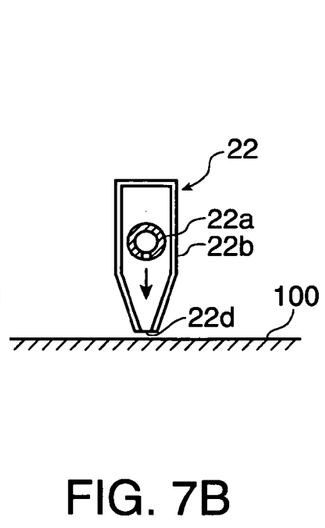

FIGS. 7A and 7B show an example how the pressure of the output gas is regulated by changing the height of the nozzle 22. As shown in FIG. 7A, the pressure of the output combustion gas is lowered by widening the gap between the semiconductor substrate 100 and the nozzle 22. As shown in FIG. 7B, the pressure of the output combustion gas is raised by narrowing the gap between the semiconductor substrate 100 and the nozzle 22.

Figure 8A:
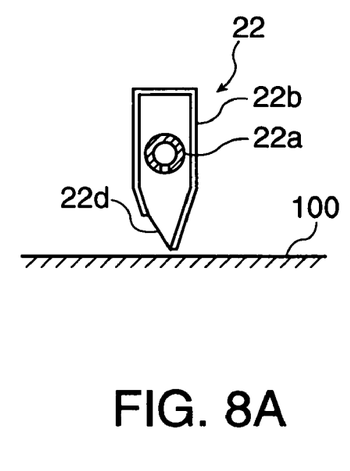
FIGS. 8A and 8B show another example how the pressure of the gas burner's flame (combustion gas) is regulated.
Figure 8B:
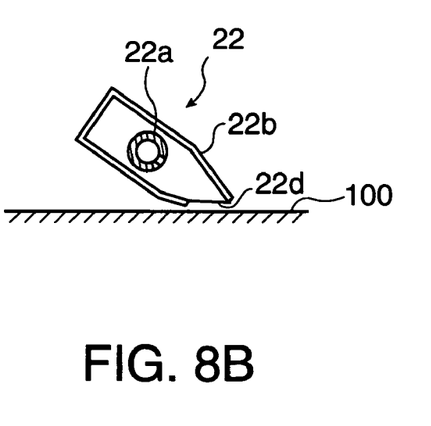

FIGS. 8A and 8B show another example how the pressure of the output gas is regulated by changing the posture (e.g. rotation angle and position) of the nozzle 22. Here, the nozzle 22d has an opening on one side as shown in FIG. 8A. Accordingly, the pressure of the output combustion gas is lowered when the gas burner 22 stands upright. When the gas burner 22 is rotated or tilted as shown in FIG. 8B, the pressure of the output combustion gas is raised as the opening of the nozzle 22 gets close to the semiconductor substrate 100.

Figure 9A:
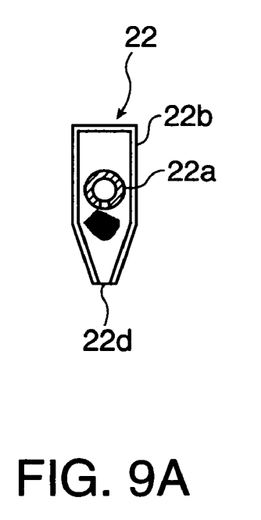
FIGS. 9A and 9B show an example how the temperature of the gas burner's flame (combustion gas) is regulated.
Figure 9B:
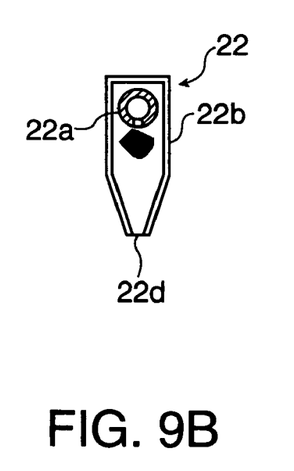

FIGS. 9A and 9B show an example how the temperature of the combustion gas output from the nozzle 22d is regulated by changing the relative positions of the air duct 22a and the shield 22b. For example, if the air duct 22a is movable forward and backward toward the nozzle 22d in the shield 22d, it is possible to move the combustion chamber 22c and change the distance between a heat source and the nozzle 22d. It is also possible to adjust the distance between the heat source and the semiconductor substrate.

Accordingly, the combustion gas output from the nozzle 22d is at a relatively high temperature if the air duct 22a is placed relatively close to the nozzle 22d as shown in FIG. 9A.

The combustion gas output from the nozzle 22d is at a relatively low temperature if the air duct 22a is placed relatively apart from the nozzle 22d as shown in FIG. 9B.

This structure advantageously regulates the temperature of the output combustion gas without changing the gap between the gas burner 22 and the semiconductor substrate 100. Of course, it is possible to regulate the gas temperature by changing the gap between the gas burner 22 and the semiconductor substrate and further by changing the relative positions of the air duct 22a and the shield 22b.

The gas burner structures shown in FIGS. 4A through 9B can be used together in combination.

For example, the structures shown in FIGS. 7A, 7B, 9A and 9B can be used together in combination. Specifically, the gas burner 22 shown in FIGS. 7A and 7B is moved close to or apart from the semiconductor substrate 100, making it possible to change the gap between the nozzle 22d and the semiconductor substrate 100 to regulate the temperature on the surface of the semiconductor substrate 100. In addition, the air duct 22a included in the gas burner 22 is movable forward and backward toward the nozzle 22d as shown in FIGS. 9A and 9B, making it possible to finely regulate the temperature on the surface of the semiconductor substrate 100. Accordingly, the surface of the semiconductor substrate 100 can be at a desirable heat-treatment temperature more easily.

For another example, the structures shown in FIGS. 7A, 7B, 8B and 8B can be used together in combination. Specifically, the gas burner 22 is moved close to or apart from the semiconductor substrate 100, making it possible to change the gap between the nozzle 22d and the semiconductor substrate 100 to regulate the temperature and flame pressure on the surface of the semiconductor substrate 100. Also, the posture of the gas burner 22 relative to the semiconductor substrate 100 is adjusted to regulate the temperature and flame pressure on the surface of the semiconductor substrate 100.

For another example, the structures shown in FIGS. 7A, 7B, 8A, 8B, 9A and 9B can be used together in combination. Specifically, the gas burner 22 is moved close to or apart from the semiconductor substrate 100, making it possible to change the gap between the nozzle 22d and the semiconductor substrate 100 to roughly regulate the temperature and flame pressure on the surface of the semiconductor substrate 100. Also, the posture of the gas burner 22 relative to the semiconductor substrate 100 is adjusted to regulate the flame pressure on the surface of the semiconductor substrate 100. Furthermore, the air duct 22a included in the gas burner 22 is movable forward and backward toward the nozzle 22d, making it possible to finely regulate the temperature on the surface of the semiconductor substrate 100. As a result, more accurate heat treatment is available.

Although not shown, it is also possible to provide a movable shield plate to the nozzle 22d included in the gas burner 22 to change the width of a nozzle aperture stop in the scanning direction of the gas burner 22. This structure enables to regulate time for exposing a processed portion of the semiconductor substrate 100 in the scanning direction of the gas burner 22, and a heat-treatment temperature profile, heat-treatment temperature and flame pressure on the semiconductor substrate 100, for example.

The above-described semiconductor manufacturing apparatus according to the present embodiment includes such a rectangular gas burner that can cross a semiconductor substrate and can provide a large substrate like a windowpane with heat treatment. Moreover, since water is decomposed by an electric current to acquire hydrogen and oxygen serving as fuels, these gas materials are easily available with low running costs.

In the heat treatment, a reducing atmosphere or an oxidizing atmosphere is easily available by appropriately setting the mixing ratio and flow of hydrogen and oxygen. It is also easy to regulate the flame temperature. Furthermore, the status (e.g. temperature, gas pressure) of the flame can be regulated by introducing an inert gas as necessary.

In addition, a desirable temperature profile is easily available by changing the nozzle shape of the gas burner, for example.

Semiconductor Manufacturing Method

Referring now to FIGS. 10A to 10F, a method for manufacturing a semiconductor device (a thin-film transistor, hereinafter called the "TFT") according to another embodiment of the invention using the above-described semiconductor manufacturing apparatus will be described.

In the present embodiment, a semiconductor layer is provided on a substrate and then undergoes heat treatment in a hydrogen-rich atmosphere, so that the layer is recrystallized and modified. Furthermore, a gate insulation layer is provided and then undergoes heat treatment in an oxygen-rich atmosphere, so that an interface between the gate insulation layer and the semiconductor layer is modified.

Figure 10A:
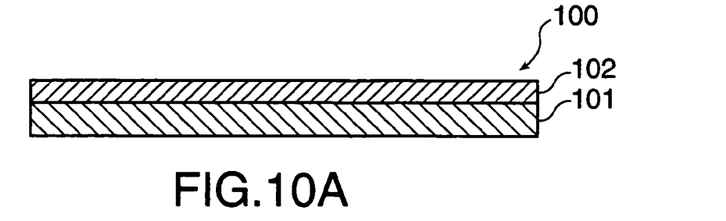
FIGS. 10A through 10F illustrate a process for manufacturing a semiconductor device in which the gas burner is used.
Figure 10B:
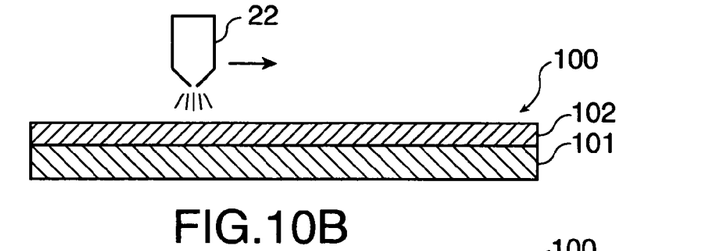

First, a silicon layer 102 is deposited by chemical vapor deposition (CVD) or the like on a large glass substrate 101 used for a liquid crystal display as shown in FIG. 10A. Then, the gas burner 22 provides the silicon layer 102 with first heat treatment as shown in FIG. 10B to recrystallize the layer to be a polysilicon layer. For example, the silicon layer 102 is recrystallized by being exposed to a flame (high-temperature gas) emitted from the nozzle 22d of the gas burner at a high temperature ranging from 600 to 1500 degrees Celsius, with a width of 10 mm in the flame scanning direction and a low pressure of 0.1 to 0.2 MPa for a short period of about 1 millisecond to 100 milliseconds. Therefore, a glass substrate for a liquid crystal display even with poor heat resistance can be used as the substrate here.

For the first heat treatment, the mixing ratio of hydrogen and oxygen is regulated by a preset program of the gas controller 15 to be hydrogen rich that is the ratio of hydrogen is larger than the hydrogen-oxygen reaction ratio of 2:1. An optimum mixing ratio is obtained by a theoretical figure and experiments. The gas burner 22 is wider than the semiconductor substrate 100 as shown in FIG. 2 and can provide the whole surface of the substrate 100 with heat treatment in one scan. The gas burner 22 provides a hydrogen-rich reducing gas flame, which reduces dangling bonds in the silicon layer 102 with excess hydrogen in the combustion gas as well as heating and recrystallizing the silicon layer. Consequently, the carrier-trap density at crystal grain boundaries is lowered, and the TFT property (i.e., carrier mobility) which will be described later improves.

It should be noted that even with a stoichiometric hydrogen-oxygen mixture, hydrogen and oxygen are available by ionization of vapor in the combustion gas. Otherwise, there remain hydrogen and oxygen gases that are not completely combusted. It is also possible to terminate dangling bonds in the silicon layer 102 with the hydrogen and oxygen.

Figure 10C:
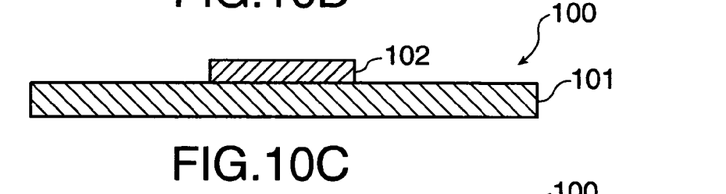

Then, the silicon layer 102 is patterned to provide an island-like semiconductor element region as shown in FIG. 10C.

Figure 10D:
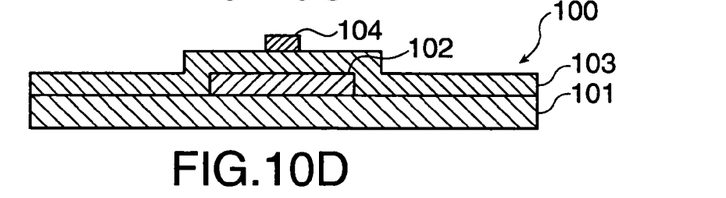

Next, a gate insulation layer of the TFT is provided as shown in FIG. 10D. For example, a silicon oxide film of tetraethoxysilane (TEOS) is deposited by CVD to provide the gate insulation layer. In addition, a metal material, such as aluminum, is deposited by sputtering. The deposited material is patterned to provide a gate electrode wiring layer 104. Alternatively, the gate electrode wiring layer 104 may be made by applying a liquid metal material along a gate electrode wiring pattern by a droplet discharge method and then drying the material.

With the gate electrode wiring layer 104 as a mask, impurity ions are heavily doped in the silicon layer 102 to provide a source region and a drain region.

Figure 10E:
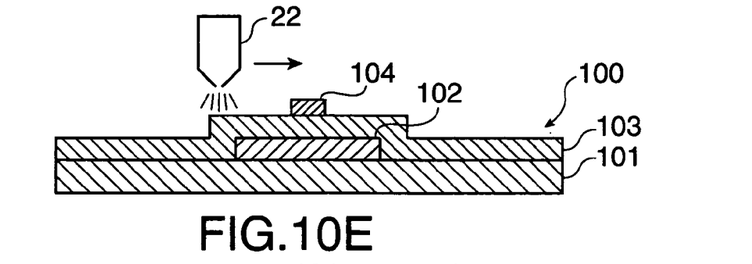

Then the gas burner 22 provides second heat treatment as shown in FIG. 10E to activate the impurity. The gas burner 22 preferably provides an oxidized flame for the second heat treatment. The oxidized flame is available by making the mixed gas oxygen rich. Oxygen in the atmosphere binds to dangling bonds of silicon atoms at, for example, an interface between the silicon layer 102 and an silicon oxide film (gate insulation layer) 103, which electrically inactivates the silicon atoms and decreases an interface state density. Therefore, process parameters of the semiconductor manufacturing apparatus for the second heat treatment are as follows: the flame of the gas burner 22 is set at a low temperature ranging from 300 to 600 degrees Celsius, and the flame pressure is set at a high pressure ranging from 1.0 to 2.0 MPa.

Figure 10F:
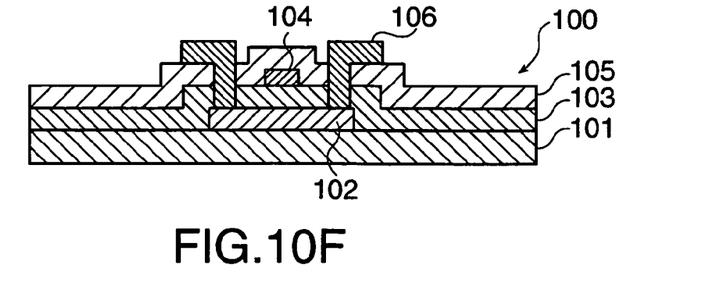

As shown in FIG. 10F, a normal TFT manufacturing process follows to complete the TFT. Specifically, a silicon oxide film is deposited by CVD or the like to provide an interlayer insulation layer 105. Then, a contact hole is formed in the interlayer insulation layer above the source and drain regions of the silicon layer 102. This contact hole is filled with a metal or other conductive material thereafter. Then, aluminum or other wiring material is deposited on the whole substrate, and patterned to complete the TFT (semiconductor device).

The TFT shown in the drawing can be used as a driving element for a pixel electrode used in a liquid crystal display or electrophoresis device, a driving element for an organic electroluminescent element, an element for a logic circuit, a memory circuit, or an arithmetic circuit, for example.

The above-described semiconductor manufacturing method according to the present embodiment uses such a rectangular gas burner that can provide a large substrate with heat treatment. In the heat treatment, a heat-treated portion can be in a reducing atmosphere or an oxidizing atmosphere. Accordingly, each interface of insulation films (e.g. gate insulation film) and semiconductor films (e.g. silicon) is modified by selectively including hydrogen, oxygen, or vapor in the flame.

Electronic Apparatus

Figure 11:
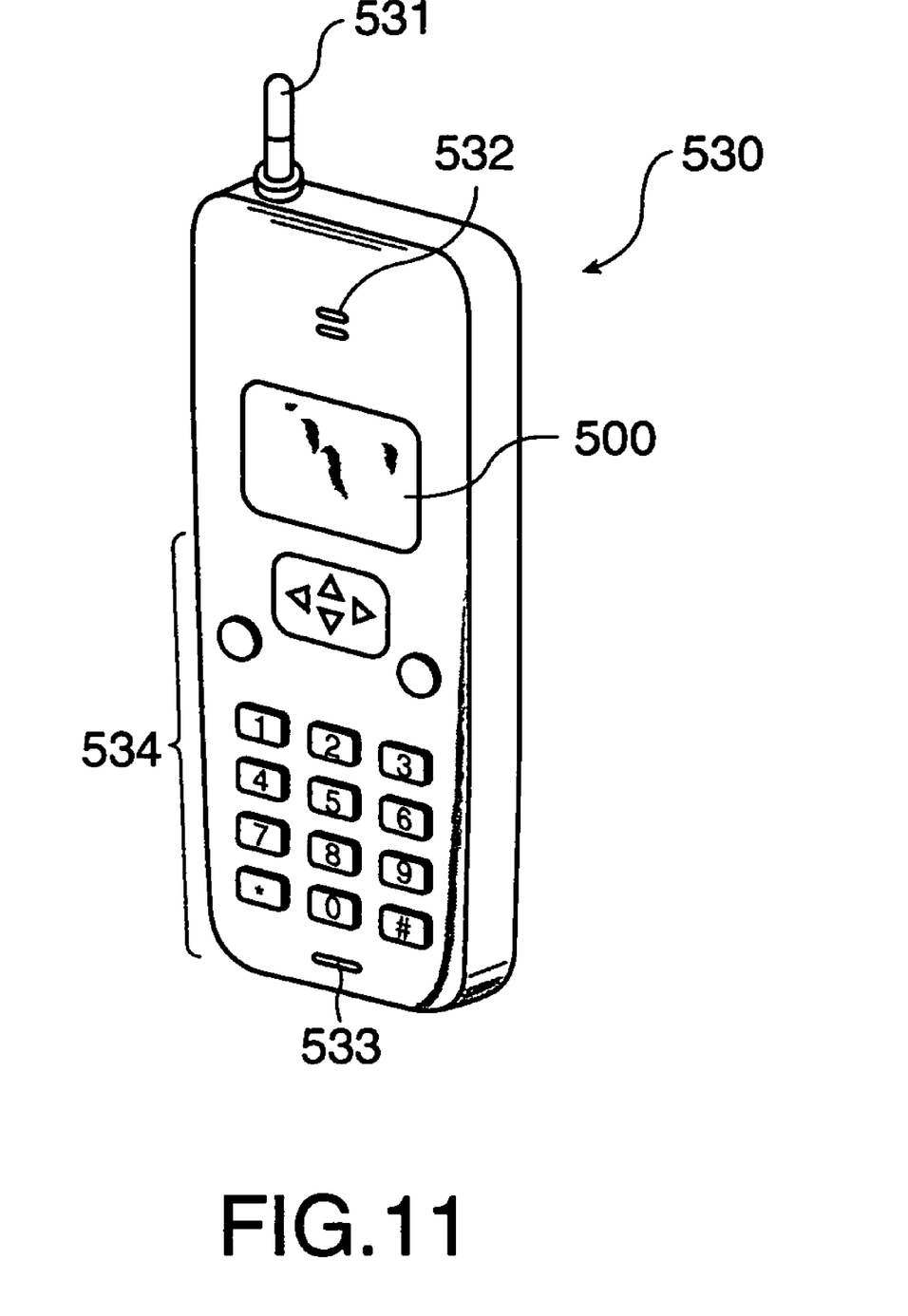
FIG. 11 is a diagram to illustrate an electronic apparatus using the semiconductor device.

FIG. 11 illustrates an electronic apparatus manufactured according to any of the above-described embodiments. The invention is typically applied to electronic apparatuses including a display circuit, a driving circuit, a memory circuit, and an arithmetic circuit manufactured by using a TFT provided on a glass or resin substrate, for example. Specifically, the invention is applied to a display, such as a liquid crystal display, an electrophoresis display, and an organic electroluminescent display, manufactured by using the above-described semiconductor manufacturing apparatus or method.

Referring to FIG. 11, a semiconductor device manufactured according to any of the above-described embodiments is used as an image display 500 of a cellular phone. This cellular phone 530 includes an antenna 531, an audio output part 532, an audio input part 533, an operating part 534, and an electrophoresis display 100 manufactured according to any of the above-described embodiments. The electrophoresis display 100 is thus applicable as a display of the cellular phone 530.

The invention is not limited to the above-mentioned example, but can also be applied to manufacturing of various electronic apparatuses providing image and character displays. For example, the invention can be applied to electronic paper, personal digital assistants, electronic organizers, electronic bulletin boards, and advertising displays.

What is claimed is:

1. A semiconductor manufacturing apparatus, comprising:
a water tank that stores water;
an electrolytic tank in which the water is decomposed into a hydrogen-and-oxygen mixed gas by an electric current;
a gas burner that combusts the hydrogen-and-oxygen mixed gas to provide a linear flame,
the gas burner including a rotatable air duct that introduces the mixed gas, the rotatable air duct rotating about its central lengthwise axis and including gas outlets positioned along a length of the rotatable air duct,
wherein the gas outlets are disposed in a spiral manner along the length of the air duct around the central lengthwise axis of the air duct;
a shield that includes a combustion chamber that surrounds the air duct and where the mixed gas combusts, and a nozzle that has a linear opening and emits a combustion gas;
a gas controller that adds a gas to the mixed gas to regulate a mixing ratio of the mixed gas; and
a moving mechanism that moves a semiconductor substrate relative to the flame of the gas burner in a direction perpendicular to the flame;
wherein the air duct having a portion defining a plurality of openings at regular intervals and being moved forward and backward or rotated.

2. The semiconductor manufacturing apparatus according to claim 1, the air duct being moved forward and backward toward a nozzle in a shield.

3. The semiconductor manufacturing apparatus according to claim 1, the gas controller emitting a relatively hydrogen rich mixed gas to recrystallize a semiconductor film deposited on the semiconductor substrate.

4. The semiconductor manufacturing apparatus according to claim 1, the gas controller emitting a relatively oxygen rich mixed gas to provide a gate insulation film deposited on the semiconductor substrate with heat treatment.

5. The semiconductor manufacturing apparatus according to claim 1, the gas controller adding an inert gas to the mixed gas to regulate a temperature of the flame.

6. The semiconductor manufacturing apparatus according to claim 1, further comprising:
a heater that heats the semiconductor substrate.

* * * * *